United States Patent
Smith

(10) Patent No.: US 7,956,400 B2
(45) Date of Patent: Jun. 7, 2011

(54) MIM CAPACITOR INTEGRATION

(75) Inventor: Brad Smith, Gieres (FR)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 12/304,194

(22) PCT Filed: Jun. 15, 2006

(86) PCT No.: PCT/IB2006/054677
§ 371 (c)(1),
(2), (4) Date: Dec. 10, 2008

(87) PCT Pub. No.: WO2008/010028
PCT Pub. Date: Jan. 24, 2008

(65) Prior Publication Data
US 2009/0200638 A1    Aug. 13, 2009

(51) Int. Cl.
*H01L 27/108* (2006.01)
*H01L 29/94* (2006.01)
(52) U.S. Cl. .......... 257/306; 438/396; 257/E21.019; 257/E21.396
(58) Field of Classification Search .......... None
See application file for complete search history.

(56) References Cited

U.S. PATENT DOCUMENTS

| | | |
|---|---|---|
| 5,915,188 A | 6/1999 | Ramakrishnan et al. |
| 6,461,914 B1 | 10/2002 | Roberts et al. |
| 6,465,297 B1 | 10/2002 | Henry et al. |
| 6,596,579 B1 * | 7/2003 | Randazzo et al. ............ 438/253 |
| 6,613,641 B1 | 9/2003 | Volant et al. |
| 6,710,425 B2 | 3/2004 | Bothra |
| 6,723,600 B2 | 4/2004 | Wong et al. |
| 6,784,478 B2 * | 8/2004 | Merchant et al. ............ 257/303 |
| 6,919,244 B1 | 7/2005 | Remmel et al. |
| 2002/0053716 A1 | 5/2002 | Ryan et al. |
| 2003/0178666 A1 * | 9/2003 | Lee et al. .................... 257/306 |
| 2004/0061177 A1 | 4/2004 | Merchant et al. |
| 2005/0062130 A1 | 3/2005 | Ciancio et al. |

FOREIGN PATENT DOCUMENTS

| | | |
|---|---|---|
| EP | 0574275 A1 | 12/1993 |
| JP | 60257553 A | 12/1985 |
| JP | 2002280458 A | 9/2002 |
| WO | 0229865 A2 | 4/2002 |
| WO | 2002086947 A2 | 10/2002 |
| WO | 2003021661 A2 | 3/2003 |
| WO | 2005036597 A2 | 4/2005 |

* cited by examiner

*Primary Examiner* — Julio J Maldonado
*Assistant Examiner* — Shaka Scarlett

(57) ABSTRACT

An integrated metal-insulator-metal capacitor is formed so that there is an extension portion of its top plate that does not face any portion of the bottom plate, and an extension portion of its bottom plate that does not face any portion of the top plate. Vias connecting the MIM capacitor plates to conductors in an overlying metallization layer are formed so as to contact the extension portions of the top and bottom plates. Etching of the via holes is simplified because it is permissible for the via holes to punch through the extension portions of the capacitor plates. The bottom plate of the MIM capacitor is inlaid. The top plate of the MIM capacitor may be inlaid.

17 Claims, 7 Drawing Sheets

FIG.1 – PRIOR ART
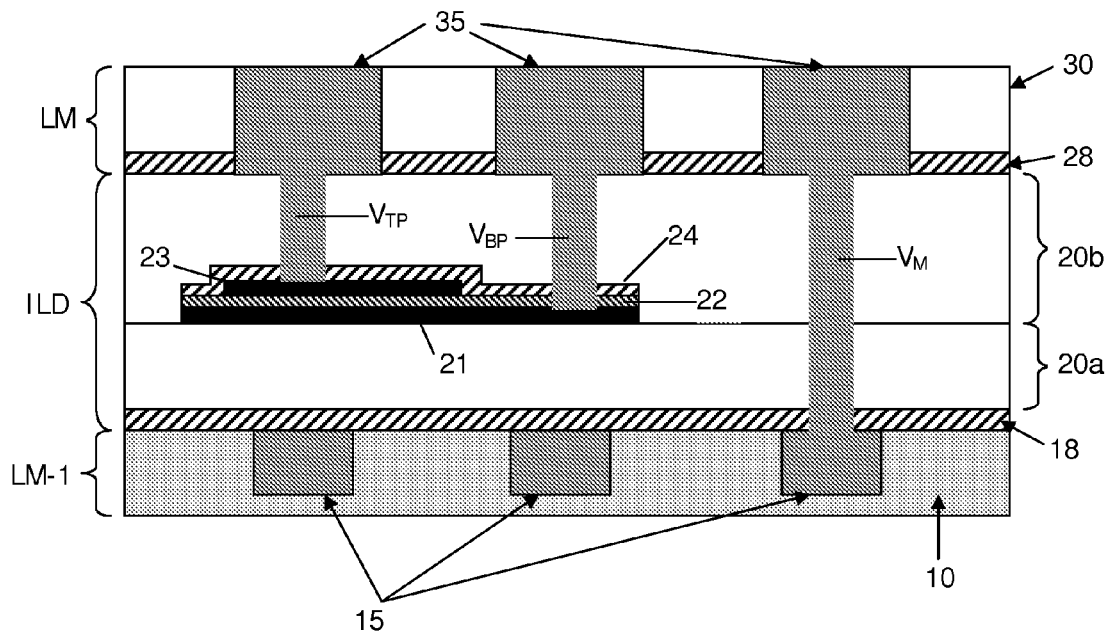
FIG.2A – PRIOR ART
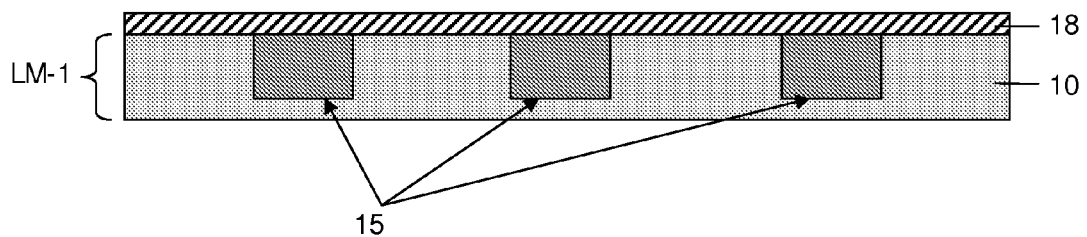
FIG.2B – PRIOR ART
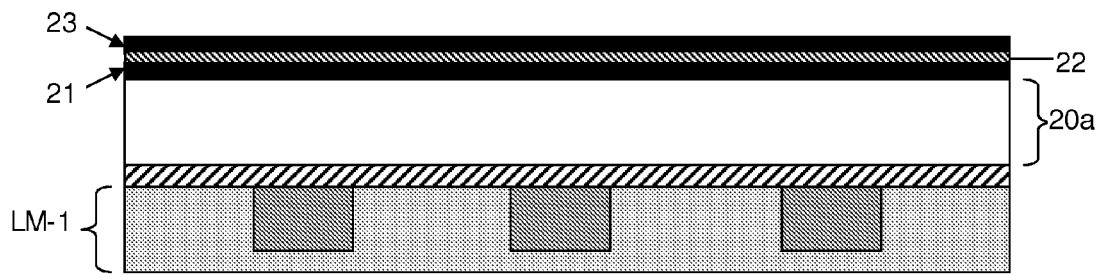

FIG.2C – PRIOR ART
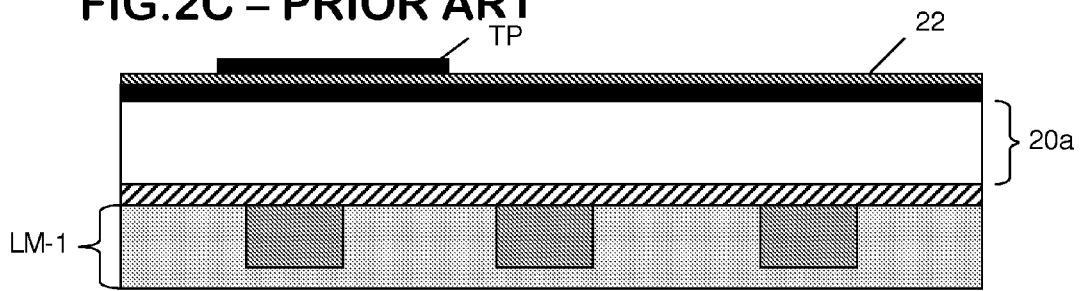
FIG.2D – PRIOR ART
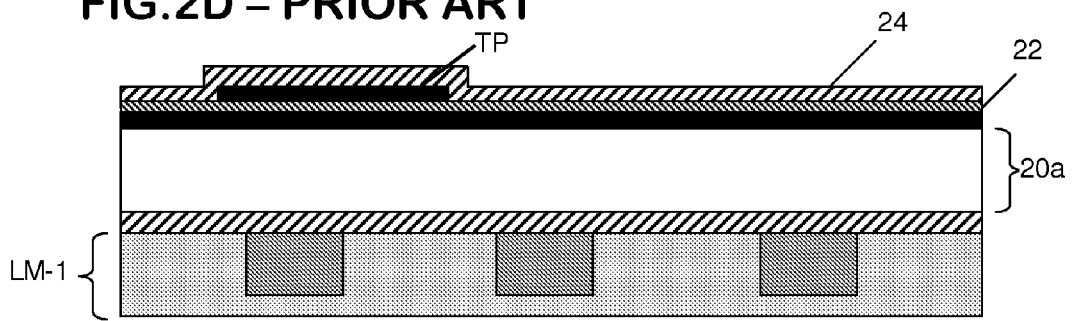
FIG.2E – PRIOR ART
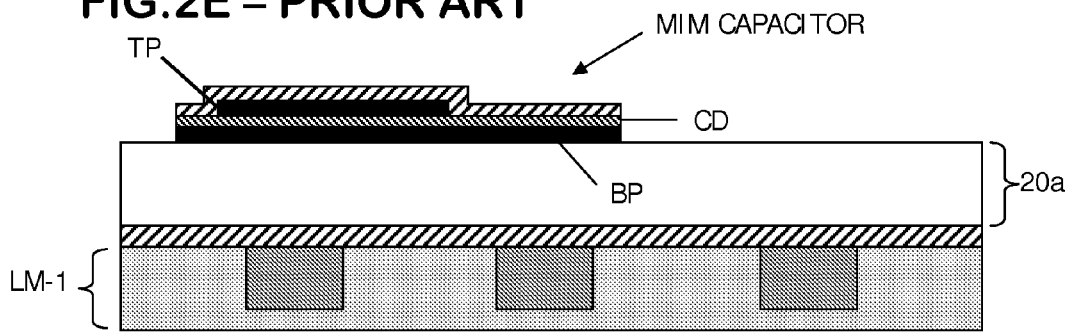
FIG.2F – PRIOR ART
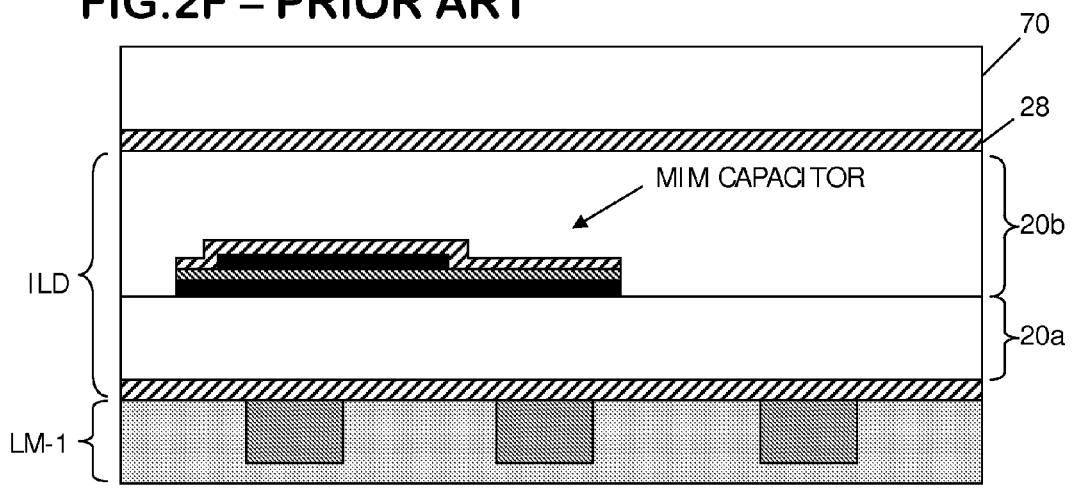

FIG.2G – PRIOR ART
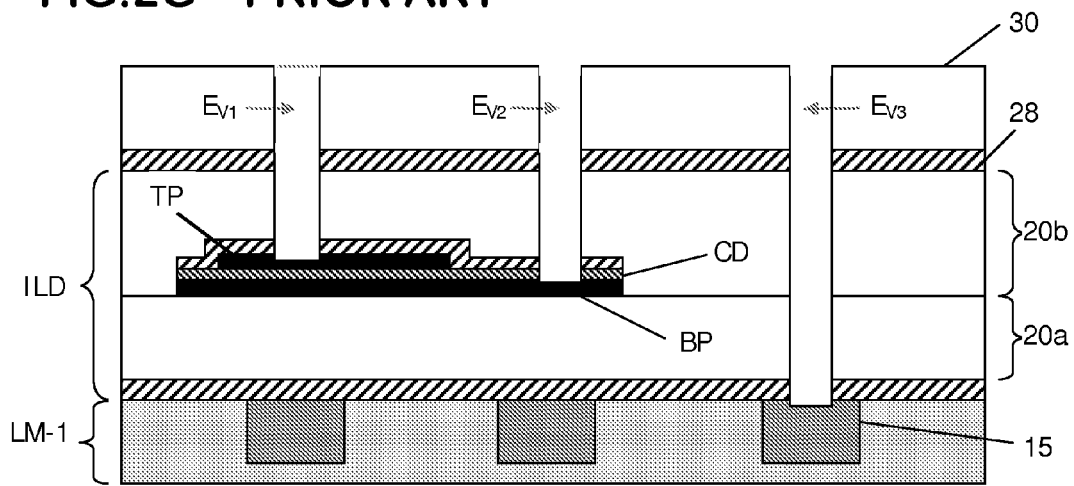
FIG.2H – PRIOR ART
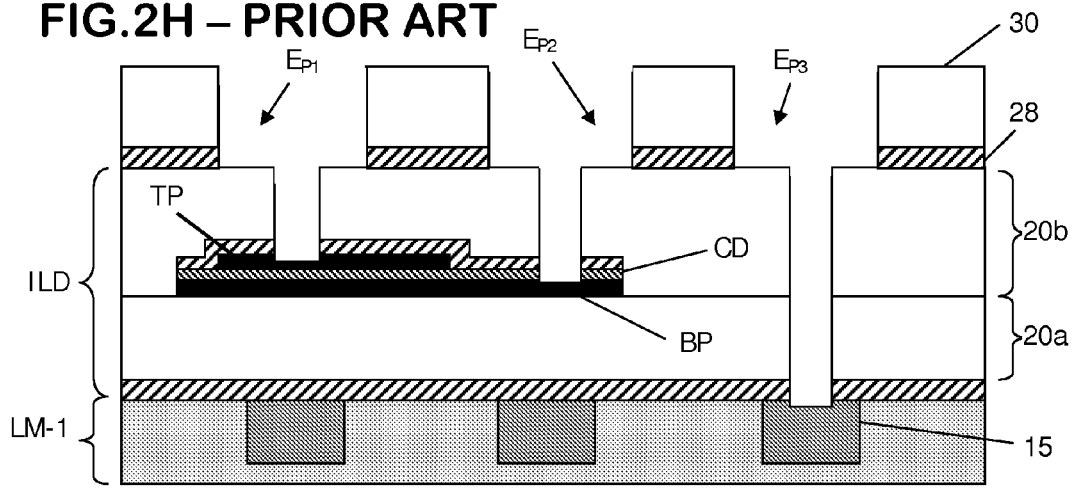
FIG.2I – PRIOR ART
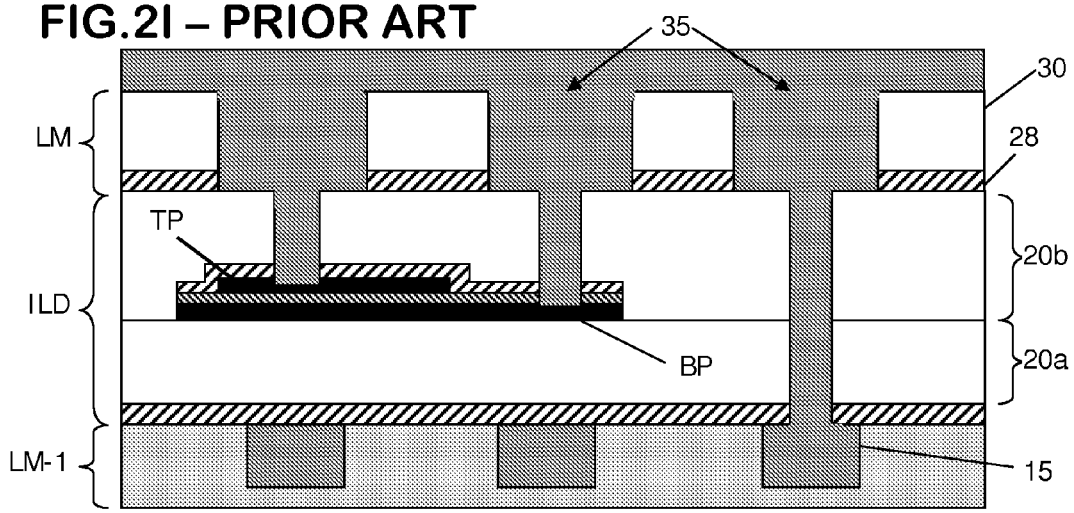

MIM CAPACITOR INTEGRATION

FIELD OF THE INVENTION

The present invention relates to integrated circuit manufacture and, more particularly, to the manufacture of integrated circuits including metal-insulator-metal (MIM) capacitors.

BACKGROUND OF THE INVENTION

During the manufacture of integrated circuit devices, notably RF or analog-mixed signal (AMS) integrated circuit devices, it is often desired to include capacitors in the circuits. Increasingly this is being achieved using MIM capacitors, especially high dielectric constant (high-k) MIM capacitors.

A number of different architectures have been proposed for integrating MIM capacitors during semiconductor manufacturing processes. In some of these architectures a MIM capacitor is formed by providing a lower plate, a dielectric layer and an upper plate stacked up within an interlayer dielectric layer located between two metal (interconnect) layers. For example, such a MIM capacitor may be provided in the interlayer dielectric between the penultimate metal layer, designated "LM-1", and the last metal layer designated "LM" (counting from the wafer outwards).

In the present document, the case where an integrated MIM capacitor is formed between the LM and LM-1 layers will be used as an illustration. However, the MIM capacitor can be formed between any two of the metallization layers in the stack formed on the semiconductor wafer. Furthermore, in the present document the expression "metallization layer" will be used both to designate the metal conductors of a particular layer as well as the dielectric into which the metallization will be patterned/filled.

FIG.1 illustrates the above-mentioned architecture in which a MIM capacitor is provided in the interlayer dielectric (ILD) between the LM and LM-1 metallization layers.

In the architecture illustrated in FIG.1, the LM-1 layer consists of a dielectric 10, typically formed of a low dielectric-constant (low-k) or ultra-low dielectric constant (ULK) material (or, possibly, of a material such as $SiO_2$, or fluorosilicate glass (FSG, i.e. fluorine-doped $SiO_2$)), in which conductive metal traces or pads 15 are provided, typically made of Al or Cu. A layer 18 of SiC, SiCN, SiN, or the like, is provided on the LM-1 layer so as to prevent oxidation of the conductive wiring/pads 15 or diffusion of material therefrom into overlying material. An interlayer dielectric layer ILD, typically made of $SiO_2$, or, for example, fluorosilicate glass (FSG, i.e. fluorine-doped $SiO_2$), is formed on the SiN layer 18 and consists of a first dielectric portion 20a, and a second dielectric portion 20b. On the dielectric layer 20a, there is a first metal layer 21 forming the bottom plate of a MIM capacitor, a capacitor dielectric layer 22, and a second metal layer 23 forming the top plate of the MIM capacitor. The top and bottom plates of the MIM capacitor are typically made of TiN and, nowadays, the capacitor dielectric is generally formed of a high-k material, such as $Ta_2O_5$, $Al_2O_3$, or $HfO_2$.

An etch-stop barrier layer 24 is formed over the MIM capacitor and is generally made of the same kind of material as can be used for layer 18, e.g. SiC. The interlayer dielectric layer ILD may be topped by an etch-stop layer 28, typically made of SiC or the like, serving to stop the etching process when trenches are etched for the conductors of the LM metallization layer. The LM dielectric layer 30 is formed on the SiC layer 28. Conductive metallic traces and/or pads 35 are formed in the LM layer. Vias $V_{TP}$, $V_{BP}$, and $V_M$, extend from certain of the conductive traces 35 of the LM layer to the top plate of the MIM capacitor, the bottom plate of the MIM capacitor and to conductive traces 15 of the LM-1 layer, respectively.

FIGS. 2A to 2I illustrate stages in a conventional method for fabricating the architecture of FIG.1. According to the conventional process, a semiconductor wafer (not shown) is processed in a conventional manner with a view to producing desired circuit elements for a number of integrated circuits. This involves doping of regions of the wafer and the formation of a number of metallization layers and interlayer dielectric layers over the wafer surface. FIG.2A illustrates the structure of a typical metallization layer LM-1 produced in this process, consisting of conductors 15 (typically made of Al or Cu) in a dielectric layer 10 (typically formed of $SiO_2$, or a low-k material such as SiCOH), topped by a SiC barrier layer 18.

A portion of $SiO_2$, interlayer dielectric 20a, is formed over the LM-1 metallization layer by any convenient technique: for example, chemical vapour deposition (CVD). Then a stack of layers is formed on the dielectric layer 20a; the stack consists of a first metallic layer 21, a dielectric layer 22 and a second metallic layer 23, as illustrated in FIG.2B. Each of the first and second metallic layers may be a unitary layer or it may be a lamination of layers of different materials. Moreover, the material or materials used in the first and second metallic layers may be the same or different from each other.

Conventional photolithographic techniques are used to pattern the second metallic layer 23 into the top plate TP for the desired MIM capacitor, see FIG.2C. Next, as illustrated in FIG.2D, the wafer is coated with an etch-stop layer 24, generally made of the same kind of material as the layer 18 (e.g. SiC or the like), by any convenient process, e.g. CVD. Next, the etch-stop layer 24, first metallic layer 21 and the dielectric layer 22 are patterned, in a common set of processes, so as to define the bottom plate BP of the MIM capacitor and the capacitor dielectric CD. Then a second portion of interlayer dielectric 20b, , a further etch-stop layer 28 (e.g. made of SiC) and a further layer 30 of dielectric are deposited—see FIG.2F.

The metallization layer LM is formed in the top section of the structure shown in FIG.2F. In general it is desirable for the metallization layer LM overlying the MIM capacitor to include metallic contacts that are connected to the top plate of the MIM capacitor, to the bottom plate of the MIM capacitor, and to metallic traces in the LM-1 metallization layer. This can be achieved using conductive vias extending through the interlayer dielectric (formed by etching via holes in the interlayer dielectric and then filling them with a conductive material). Now, in order to minimize the number of process steps, it is generally desired to etch all the desired via holes through the interlayer dielectric layer ILD in a common etching process. Thus, in a single process it is necessary to etch at least one via hole $E_{V1}$, extending to the top plate of the MIM capacitor, at least one via hole $E_{V2}$, extending to the bottom plate of the MIM capacitor and at least one via hole $E_{V3}$, extending to a metallic trace 15 in the next metallization layer down (LM-1 in this example), see FIG.2G.

Once the via holes have been etched, enlarged openings $E_{P1}$, $E_{P2}$, and $E_{P3}$ are formed in the SiC layer 28 and dielectric layer 30 at the top ends of the via holes $E_{V1}$, $E_{V2}$, and $E_{V3}$, and trenches $E_{P1}$, $E_{P2}$, and $E_{P3}$, for any other desired conductive traces/pads in the LM metallization layer are formed, by photolithographic and etching processes (see FIG.2H). Then a metallic material (e.g. Al or Cu) is applied over the structure of FIG.2H, filing the via holes and trenches $E_{P1}$, $E_{P2}$, and $E_{P3}$, as shown in FIG.2I. Finally, the wafer surface is polished, resulting in the overall architecture shown in FIG.1.

As mentioned above, during the conventional process for fabricating the MIM architecture of FIG.1, a single via-etching process is required to etch vias extending from the LM layer down to three different levels, namely to the MIM capacitor top plate, to the MIM capacitor bottom plate and to the metallization of the LM-1 layer. Moreover, the etching process is required to stop on two or more different materials, namely the metal forming the plates of the MIM capacitor and the metal of the metallization layer LM-1 (which, in general, will be a different material from the metal(s) used in the MIM capacitor top and bottom plates). The need to satisfy all of these requirements in a common etching process places considerable constraints on that process, notably in terms of finding an etching species that will have a suitable pattern of selectivities.

SUMMARY OF THE INVENTION

The present invention provides an integrated circuit device as described in the accompanying claims.

The present invention further provides a method of fabricating an integrated MIM capacitor as described in the accompanying claims.

BRIEF DESCRIPTION OF THE DRAWINGS

FIG.1 is a diagram illustrating a known architecture of an integrated MIM capacitor;

FIGS. 2A to 2I are a series of diagrams illustrating the steps in a conventional process for fabricating the architecture of FIG.1;

DETAILED DESCRIPTION OF CERTAIN EMBODIMENTS

Figure 3:
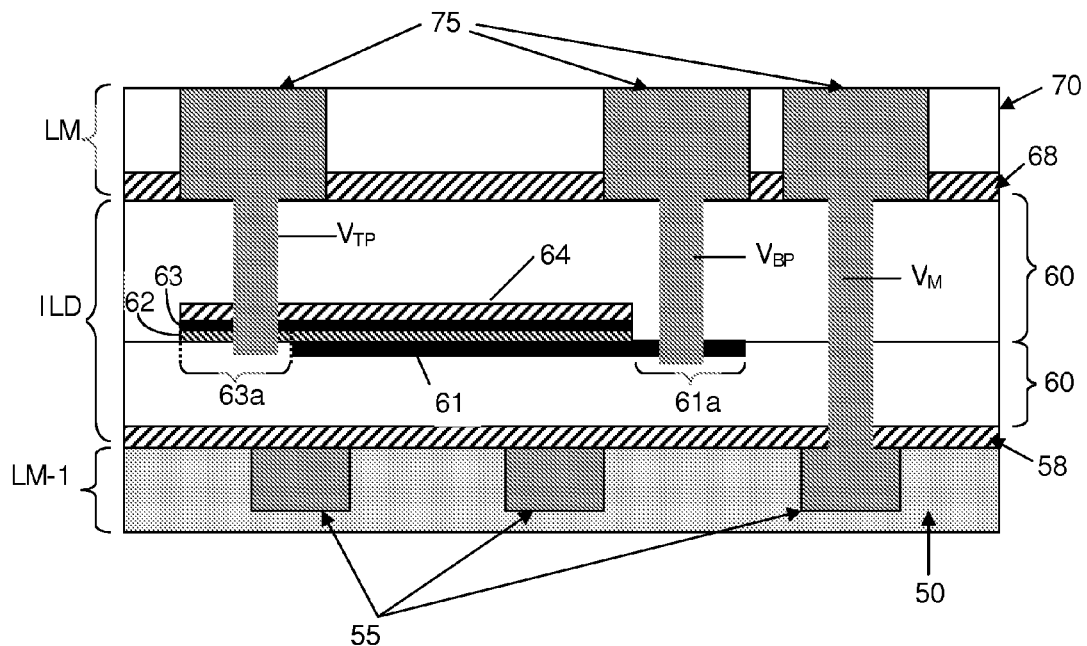
FIG.3 is a diagram illustrating the architecture of an integrated MIM capacitor according to one embodiment of the present invention.

A first embodiment of the present invention will now be described with reference to FIGS. 3 and 4. FIG.3 illustrates the architecture of the MIM capacitor according to the first embodiment and FIGS. 4A to 4H illustrate stages in the manufacture of the architecture of FIG.3.

The first embodiment will be described in the context of a fabrication process in which a MIM capacitor is formed within an interlayer dielectric layer between the LM and LM-1 metallization layers. However, it is to be understood that the same structure and techniques can be used regardless of the metallization layers between which the MIM capacitor is formed (i.e. between M1 and M2, between M2 and M3, etc.).

As illustrated in FIG.3, according to the first embodiment of the invention the LM-1 metallization layer consists of a dielectric 50, such as a low-k material (e.g. Black Diamond I made by Applied Materials Inc. of California, USA), an ultra-low-k (ULK) material (e.g. Black Diamond II, a porous low-k SiCN material made by Applied Materials Inc.), $SO_2$, fluorosilicate glass (FSG), etc., with metallic traces and/or pads 55 therein (e.g. Al or Cu traces/pads). The LM-1 metallization layer is topped with a layer 58 of SiC (or SiCN, SiN or other suitable materials) so as to inhibit oxidation of the metallic traces/pads 55 during subsequent deposition steps and to prevent leaching of the metal into the overlying layer formed thereon.

A first portion of interlayer dielectric 60$a$, for example made of $SiO_2$, FSG, etc., is provided over the SiC layer 58 and the bottom plate of the MIM capacitor is inlaid into this first interlayer dielectric potion 60$a$. The MIM capacitor dielectric 62 and MIM capacitor top plate 63 are formed so as to be offset relative to the MIM capacitor bottom plate 61. In particular, there is a portion 61$a$, of the MIM capacitor bottom plate 61 that is not overlain by the MIM capacitor dielectric 62 or by the MIM capacitor top plate 63. Similarly, there is a portion 63$a$, of the MIM capacitor top plate 63 that is not underlain by the MIM capacitor bottom plate 61. (The portions 61$a$, and 63$a$, can be seen clearly in FIG.4D.)

A second portion of interlayer dielectric 60$b$, covers the MIM capacitor, and the LM metallization layer is formed thereon. The LM metallization layer includes an etch-stop layer 68 (for use during the process etching trenches for the LM layer), a dielectric layer 70 and conductive traces and/or pads 75. The conductive traces/pads 75 (e.g. Al or Cu traces/pads) in the LM metallization layer make contact with the top and bottom plates 61, 63 of the MIM capacitor and with conductors 55 in the LM-1 metallization layer through the intermediary of conductive vias $V_{TP}$, $V_{BP}$, and $V_M$, respectively.

In the case illustrated in FIG.3, the vias $V_{TP}$, and $V_{BP}$, which make contact with the top and bottom plates of the MIM capacitor pass completely through the respective capacitor plates. This is permissible because these vias $V_{TP}$, and $V_{BP}$, contact the respective top and bottom capacitor plates at locations where they are not underlain (or overlain) by another capacitor plate. In other words, in this architecture it is permissible (though not obligatory) for the vias $V_{TP}$, and $V_{BP}$, to extend right through the respective capacitor plates, because this will not produce a short-circuit. Moreover, in the case where the vias do pass completely through the respective capacitor plates there will still be the desired contact between the conductive via material and the respective capacitor plate, at the sides of the via hole as it passes through the respective capacitor plate.

A method for fabricating the architecture of FIG.3 will now be described with reference to FIGS. 4A to 4H.

Figure 4A:
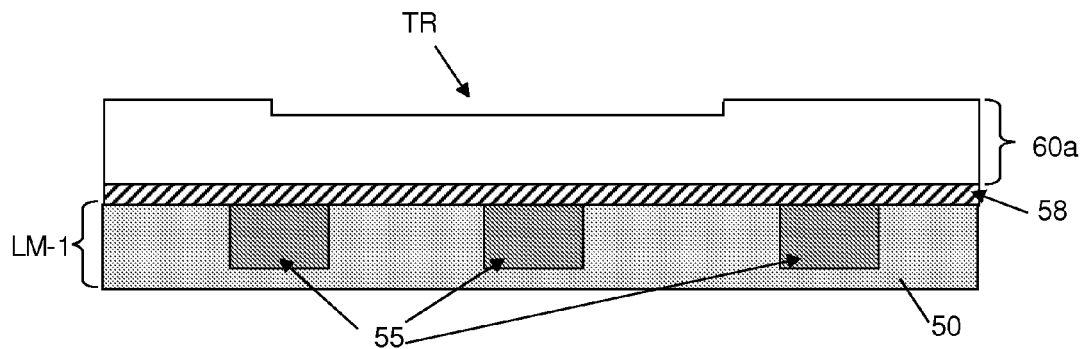
FIGS. 4A to 4H are a series of diagrams illustrating the steps in a process suitable for fabricating the architecture of FIG.3.

As illustrated in FIG.4A, a first interlayer dielectric portion 60$a$, is formed on the LM-1 metallization layer by any convenient process (for example, CVD, plasma-enhanced CVD (PECVD), etc.). This first interlayer dielectric portion 60$a$ will typically be made of $SiO_2$, but other materials can be used, for example, FSG, low-k dielectric materials (e.g. SiCOH), ultra-low-k dielectric materials (e.g. Black Diamond II), etc. The first interlayer dielectric portion 60$a$, may be planarized so as to remove unwanted topography resulting from the underlying LM-1 metallization layer.

Figure 4B:
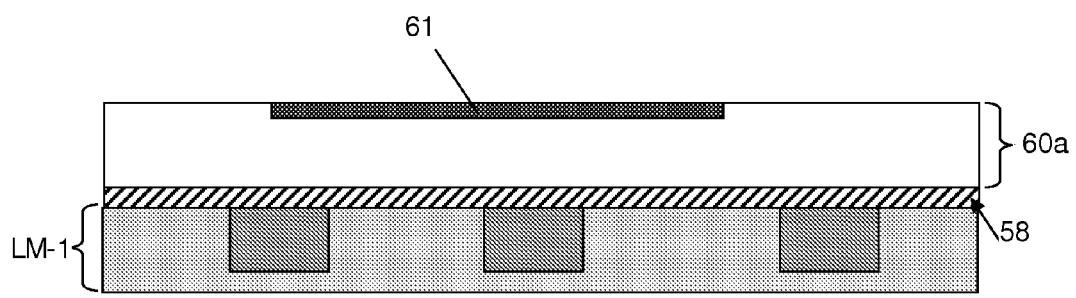

Next, a trench TR is formed in the first interlayer dielectric portion 60$a$ by a photolithographic and etching process, or any other suitable process. A metallic layer is formed over the first interlayer dielectric portion 60$a$. This metallic layer may be formed of TiN deposited by either a PVD or CVD method. Alternatively, another convenient metal or metal compound, e.g. Ta, TaN, Cu, Ru, etc., may be used, deposited by an appropriate technique or combination of techniques (e.g. Ta ALD+Cu PVD+Cu electroplating; Ru deposited by PVD+Cu direct plating, etc.). The metallic layer is then planarized so as to leave an inlaid metallic plate 61 in the first interlayer dielectric portion 60$a$, as shown in FIG.4B. This inlaid metallic plate 61 forms the bottom plate of the MIM capacitor.

Although the above-described inlaid structure consists solely of a metallic plate 61, if desired the inlaid structure may consist of a metallic plate topped by another layer, such as: a conductive oxidation barrier (to inhibit oxidation of the metallic material forming the capacitor bottom plate in a case where that metallic material oxidizes easily), another metal layer (to promote adhesion between the interlayer dielectric and the capacitor plate metal and/or between the capacitor plate metal and the capacitor dielectric), or to achieve a desired sheet resistance. Multiple layers may also be required in order to achieve a desired value of sheet resistance.

Figure 4C:
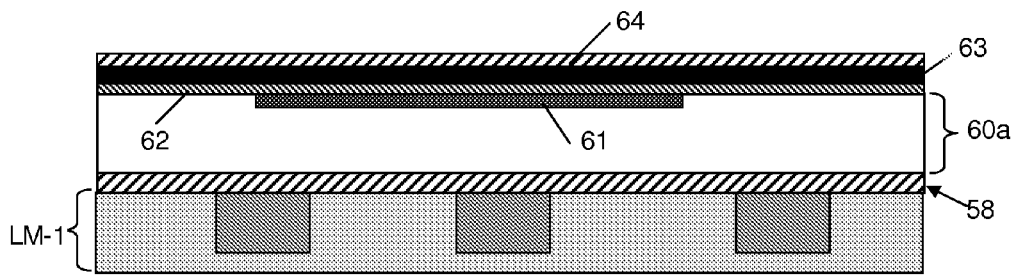
Figure 4D:
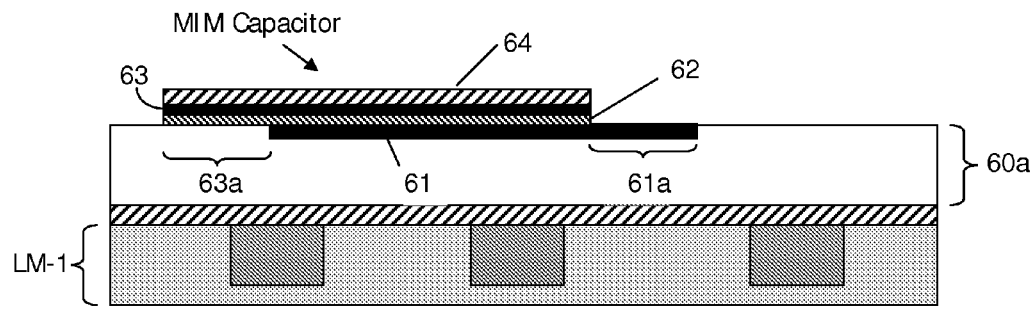

A dielectric layer 62, a second metallic layer 63 and, optionally, an etch-stop layer 64, are then formed sequentially on the first interlayer dielectric portion 60a, and the inlaid metallic plate 61, as shown in FIG.4C. The second metal layer 63 may be formed of the same material as the first metallic layer 61, but this is not mandatory. Then a common set of photolithographic and etching processes are used to pattern the second metallic layer 63 into the top plate of the MIM capacitor and to pattern the dielectric layer 62 into the MIM capacitor dielectric, as illustrated in FIG.4D. The (optional) etch-stop layer 64 is patterned into the same shape as the MIM capacitor top plate.

The mask used for patterning the top plate 63 and MIM capacitor dielectric 62 is designed to create a region 63a, of the MIM capacitor top plate that is not underlain by the bottom plate 61, and to leave a portion 61a, of the MIM capacitor bottom plate 61 that is not overlain by the top plate 63 and capacitor dielectric 62. Conventionally, the top plate of a MIM capacitor is formed so that all of it is underlain by the MIM capacitor bottom plate. This is in order to avoid the existence of sharp corners at a portion where the top plate extends beyond the bottom plate; sharp corners of this kind would cause high electric fields in use, and lead to poor time-zero breakdown and/or poor long-term reliability. However, in the presently-proposed architecture, these problems are avoided because the MIM capacitor bottom plate is inlaid.

The dielectric layer 62 will typically be made from a high-k dielectric material such as $Al_2O_3$; however, other materials are possible, for example $HfO_2$, $ZrO_2$, $TiO_2$, $Ta_2O_5$, SiN, etc, or a stack of different materials (e.g. an $Al_2O_3/Ta_2O_5$ stack). Suitable materials for the MIM capacitor top plate include, but are not limited to, Ta, TaN, Ti, TiN, Pt, Ir, Al, W, Ru, Cu, Al, etc.

The (optional) etch-stop layer 64 will typically be made of SiN, SiC or another suitable material.

The respective techniques used for depositing the dielectric layer 62, the second metallic layer 63 and the (optional) etch-stop layer 64 are adapted to the materials selected for these layers. Thus, for example, ALD, CVD, etc. may be suitable deposition techniques for the dielectric layer 62, PVD may be a suitable technique for deposition of the second metallic layer 63 (e.g. if it is made of TiN), and CVD may be a suitable deposition technique for the etch-stop layer 64.

Figure 4E:
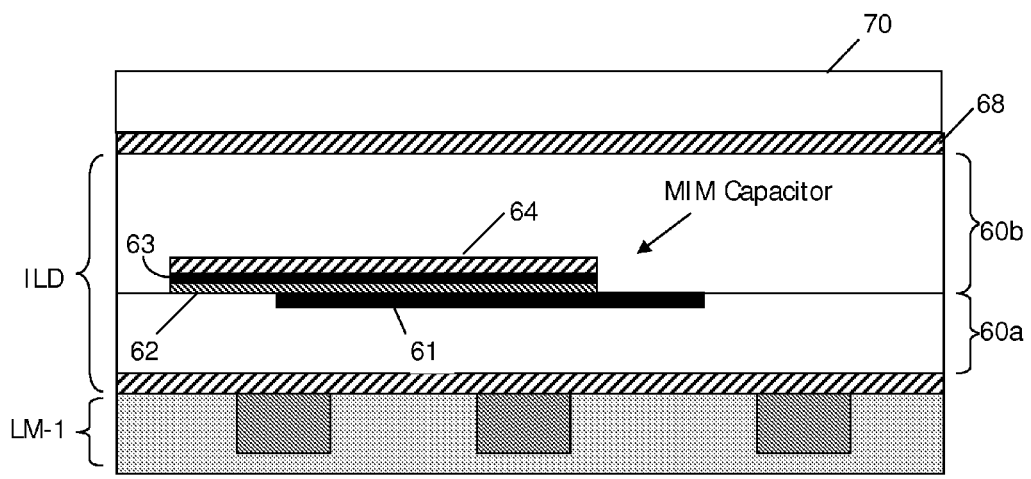

A second interlayer dielectric portion 60b, is deposited, for example by CVD or PECVD, over the first interlayer dielectric portion 60a, the remaining portion of the etch-stop layer 64 and the exposed portion of the MIM capacitor bottom plate 61. This second dielectric layer portion 60b, will generally be made of the same material as the first interlayer dielectric portion 60a. An etch-stop layer 68 of SiC or the like (SiCN, SiN, etc.)—for stopping etching of trenches for the conductors in the LM metallization layer—is then formed over the second interlayer dielectric portion 60b, as illustrated in FIG.4E. The etch-stop layer 68 is helpful when etching deep trenches such as those found in the LM layer, but it is not essential. The dielectric material 70 for the LM metallization layer is then deposited over the etch-stop layer 68. The dielectric layer 70 will typically be made of $SiO_2$, or FSG if the MIM capacitor is being integrated between the LM and LM-1 metallization layers. However, if the MIM capacitor is being integrated between lower metallization layers (i.e. layers that are closer to the wafer than are the LM and LM-1 layers), then the dielectric layer 70 may be formed of $SiO_2$, FSG, or of low-k or ULK dielectric material.

Figure 4F:
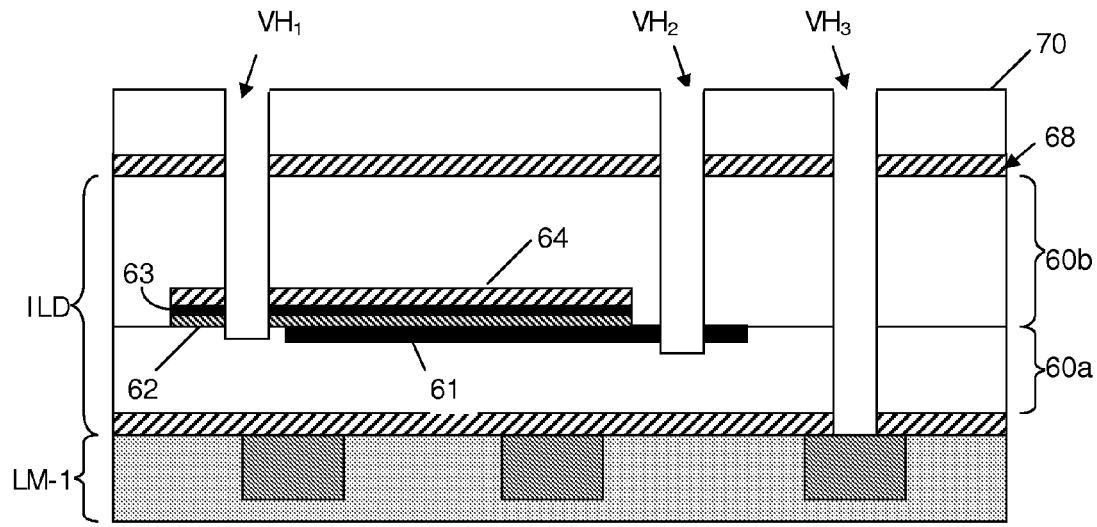

Next, an etching process is performed so as to form, simultaneously, via holes $VH_1$, $VH_2$, and $VH_3$, for the vias that will contact the MIM capacitor top plate 63, MIM capacitor bottom plate 61 and a metallic trace/pad 55 of the LM-1 metallization layer—see FIG.4F.

The via hole $VH_1$, intended for the via connecting to the MIM capacitor top plate 63 is positioned so as to contact the MIM capacitor top plate 63 at the region 63a, thereof which is not underlain by the capacitor bottom plate 61, and the via hole $VH_2$, intended for the via connecting to the MIM capacitor bottom plate 61 is positioned so as to contact the MIM capacitor bottom plate 61 at the region 61a, thereof which is not overlain by the capacitor top plate 63. Because of this, even if the via holes are etched so that they pass completely through the MIM capacitor plates this does not result in contact being made between the capacitor plates (when the via holes are filled). Thus, constraints on the etching process are eased.

More particularly, for known MIM capacitor architectures and fabrication processes, such as those described above with reference to FIGS. 1 and 2, it is usually difficult to find a suitable set of etching conditions (choice of etching species, time duration, bias power, pressure, etc.) which will enable via holes to be etched satisfactorily to the MIM capacitor top and bottom plates as well as to metallic traces/pads in an underlying metallization layer, because it is difficult for the etch process to stop reliably at the different depths and on the different materials that are involved.

By way of contrast, according to the present invention the via holes extending to the top and bottom plates of the MIM capacitor need not stop precisely within those plates, it is permissible for them to pass right through, provided that they do not extend all the way down to the metallic traces/pads of the underlying metallization layer. This produces a significant increase in the tolerance of the etching process to variation in the depths of the via holes. It is now sufficient to use a set of etching conditions whose selectivity ensures that the via holes extending to the MIM capacitor plates will not extend all the way down to the metallic traces/pads of the underlying metallization layer, rather than being obliged to limit the depth of those via holes precisely to the depths of the MIM capacitor top and bottom plates.

Figure 4G:
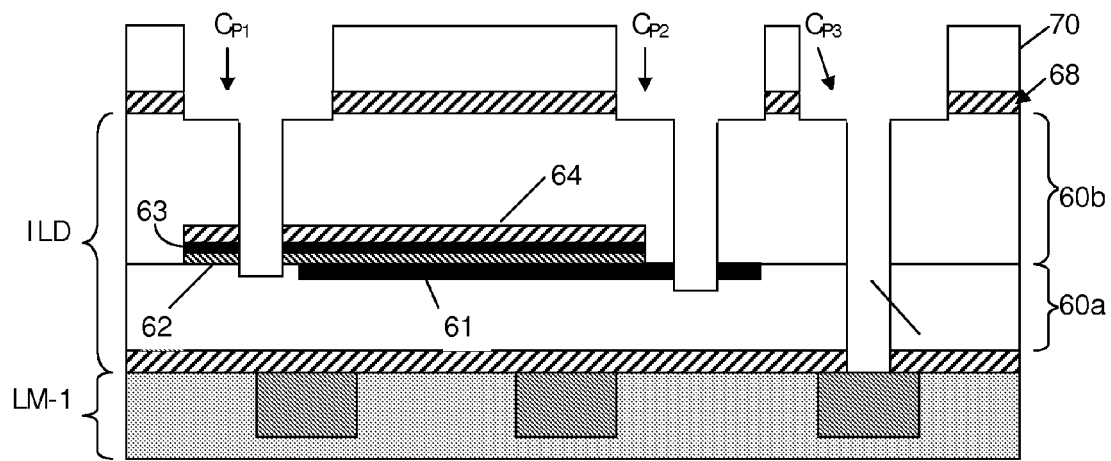
Figure 4H:
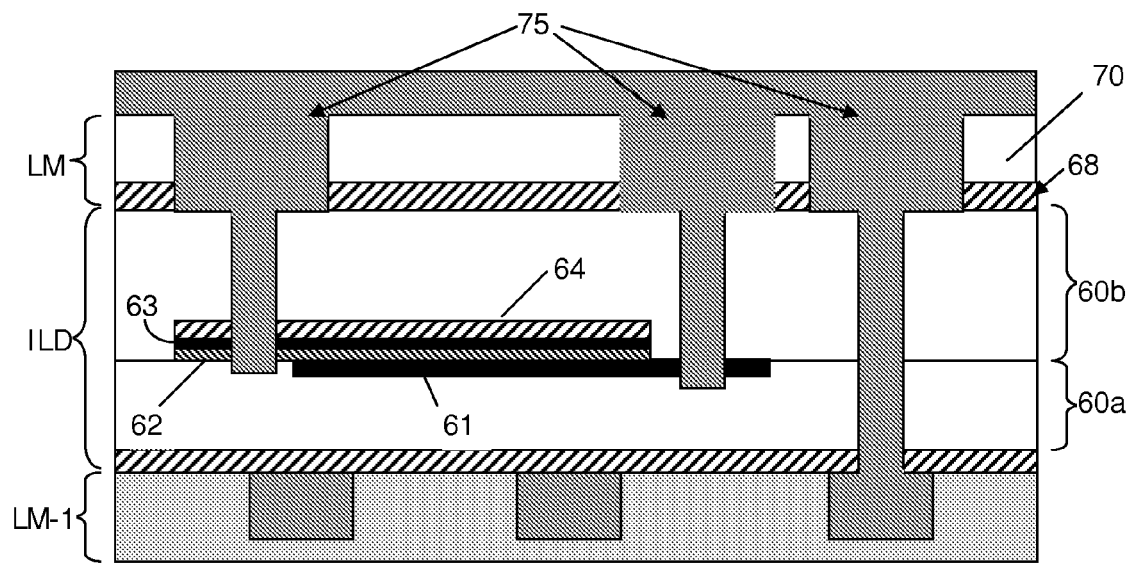

Once the via holes $VH_1$, $VH_2$, and $VH_3$, have been etched, openings $C_{P1}$, $C_{P2}$, and $C_{P3}$, for metal traces/pads are patterned photolithographically and etched into the dielectric 70 and etch stop layer 68, as illustrated in FIG.4G. Next, a metallic layer, typically formed of Al or Cu (or, possibly another material, e.g. W), is deposited over the wafer, filling the via holes VH1, VH2, and VH3 and forming the metallic traces or pads 75 of the LM metallization layer, including certain traces/pads 75 in contact with the now-filled vias $V_{TP}$, $V_{BP}$, and $V_M$, as illustrated in FIG.4H. The wafer surface is then polished so as to produce the finished architecture illustrated in FIG.3.

In the above-described first embodiment, only the bottom plate of the MIM capacitor is formed inlaid (i.e. by filling a trench in an already-present layer), the MIM capacitor top plate is by depositing a metallic layer then patterning that layer. However, according to a second embodiment of the invention, both the MIM capacitor top plate and the MIM capacitor bottom plate are inlaid.

Although the present invention has been described with reference to particular embodiments thereof, it is to be understood that the present invention is not limited by reference to the particularities of the above-described embodiments. More particularly, the skilled person will readily appreciate that modifications and developments can be made in the above-described embodiments without departing from the scope of the invention as defined in the accompanying claims.

For example, although the above description and associated drawings illustrate an architecture containing a small number of metallic traces/pads in the metallization layers, it is to be understood that this is a simplification for the purpose of ease of understanding; in practice, there would be a large number of metallic traces/pads.

In a similar way, the number of via holes and vias shown in the drawings is not to be taken as limitative. For example, in the figures, only one of the metallic traces in the lower metallization layer is shown as being contacted by a via extending down from the overlying metallization layer. In practice, there will generally be numerous vias is shown extending to a metallic trace in the LM-1 metallization layer. In practice the number of vias extending down from the upper metallization layer, and the proportion of the traces/pads in the underlying metallization layer that are contacted thereby, can vary widely.

Also, the skilled person will readily understand that, if desired, the barrier layers formed on the metallization layers can be formed selectively (so as to cover only the metal traces/pads) rather than, like layer 58 in FIG. 3, extending over the whole of the underlying metallization layer.

Moreover, it is to be understood that references in the present document to elements or layers being "over" or "under" one another, or to elements being "above" or "below", "upper" or "lower", "top" or "bottom", do not imply an absolute orientation in space, rather they refer to the location of the respective elements/layers when the architecture is oriented as shown in the accompanying drawings.

Finally, as mentioned above, the present invention is applicable in general to the fabrication of a MIM capacitor integrated between two metallization layers $M_N$, and $M_{N-1}$, (layer $M_N$, being above the MIM capacitor and layer $M_{N-1}$, being below the MIM capacitor). The above description of the fabrication of an integrated MIM capacitor between the LM and LM-1 metallization layers is simply an illustration of the application of the invention.

The invention claimed is:

1. An integrated circuit device comprising:
   an upper wiring layer and a lower wiring layer, and a metal-insulator-metal (MIM) capacitor in an inter-layer dielectric layer between said upper and lower wiring layers, the MIM capacitor comprising a top plate, a bottom plate and a dielectric layer between the top and bottom plates;
   wherein the MIM capacitor top plate has a region which does not face the MIM capacitor bottom plate;
   wherein the MIM capacitor bottom plate has a region which does not face the MIM capacitor top plate; and
   conductive vias extend from said upper wiring layer to the MIM capacitor top and bottom plates, including a conductive via contacting and extending through the MIM capacitor top plate at said region thereof which does not face the bottom plate, and a conductive via contacting and extending through the MIM capacitor bottom plate at said region thereof which does not face the top plate, said conductive via that contacts the top plate terminates at a first dielectric portion within the inter-layer dielectric layer between the MIM capacitor and the lower wiring layer, and the conductive via that contacts the bottom plate terminates at a second dielectric portion within the inter-layer dielectric layer between the MIM capacitor and the lower wiring layer.

2. The integrated circuit device according to claim 1, wherein the MIM capacitor bottom plate is inlaid.

3. The integrated circuit device according to claim 1, wherein the MIM capacitor top plate is inlaid.

4. A method of fabricating an integrated metal-insulator-metal (MIM) capacitor, the method comprising the steps of:
   forming a MIM capacitor bottom plate over a first dielectric layer, said first dielectric layer between said MIM capacitor and a metallization layer;
   forming a second dielectric layer over at least a portion of the MIM capacitor bottom plate;
   forming a MIM capacitor top plate over the second dielectric layer such that there is a portion of the top plate that does not face the bottom plate and a portion of the bottom plate that does not face the top plate;
   forming a third dielectric layer over the MIM capacitor top plate;
   etching a first via hole through one of said top plate at said region thereof which does not face the bottom plate and said bottom plate at said region thereof which does not face the top plate;
   etching a second via hole through said bottom plate at a region which does not face the top plate;
   stopping the etching of the second via hole through the bottom plate in the first dielectric layer between the MIM capacitor and the metallization layer, and
   stopping the etching of the first via hole at a dielectric portion of the first dielectric layer between the MIM capacitor and the metallization layer.

5. An integrated-MIM-capacitor fabrication method according to claim 4, wherein the step of forming the MIM capacitor bottom plate comprises the step of forming an inlaid bottom plate.

6. An integrated-MIM-capacitor fabrication method according to claim 4, wherein the step of forming the MIM capacitor top plate comprises the step of forming an inlaid top plate.

7. The integrated circuit device according to claim 2, wherein the MIM capacitor top plate is inlaid.

8. An integrated-MIM-capacitor fabrication method according to claim 5, wherein the step of forming the MIM capacitor top plate comprises the step of forming an inlaid top plate.

9. An integrated circuit device comprising:
   a metal-insulator-metal (MIM) capacitor in a first dielectric layer, the MIM capacitor underlying an upper surface of the integrated circuit device and comprising a top plate, a bottom plate, and a second dielectric layer between the top plate and the bottom plate; and
   a first conductive via in contact with and extending through the bottom plate, and the first conductive via terminating at a dielectric portion within the first dielectric layer underlying MIM capacitor.

10. An integrated circuit device according to claim 9, further comprising a second conductive via in contact with and extending through the top plate, and the second conductive via terminating within the first dielectric layer underlying MIM capacitor.

11. An integrated circuit device according to claim 10, wherein the MIM capacitor top plate is inlaid.

12. An integrated circuit device according to claim 11, wherein the MIM capacitor bottom plate is inlaid.

13. An integrated circuit device according to claim 10, wherein the MIM capacitor bottom plate is inlaid.

14. An integrated circuit device according to claim 9, wherein the MIM capacitor top plate is inlaid.

15. An integrated circuit device according to claim 14, wherein the MIM capacitor bottom plate is inlaid.

16. An integrated circuit device according to claim 15, wherein the MIM capacitor bottom plate is inlaid.

17. An integrated circuit device according to claim 9, wherein the MIM capacitor bottom plate is inlaid.

* * * * *